United States Patent [19]

Herzog

[11] Patent Number: 4,839,616

[45] Date of Patent: Jun. 13, 1989

[54] BROADBAND IMPEDANCE TRANSFORMER

[75] Inventor: Will Herzog, Rochester, N.Y.

[73] Assignee: Harris Corporation, Rochester, N.Y.

[21] Appl. No.: 514,884

[22] Filed: Jul. 18, 1983

[51] Int. Cl.[4] .............................................. H03H 7/38
[52] U.S. Cl. ...................................... 333/32; 336/82; 336/195
[58] Field of Search .................... 333/25, 32, 119, 131; 336/82, 195; 343/822, 860

[56] References Cited

U.S. PATENT DOCUMENTS

| | | | |
|---|---|---|---|
| 2,470,307 | 5/1949 | Guanella | 333/121 X |
| 2,550,891 | 5/1951 | Wald | 333/32 X |
| 3,273,098 | 9/1966 | Saito | 336/82 X |

FOREIGN PATENT DOCUMENTS 2807327 12/1978 Fed. Rep. of Germany ...... 333/131

Primary Examiner—Paul Gensler
Attorney, Agent, or Firm—Rogers & Killeen

[57] ABSTRACT

A transformer for modifying the characteristics impedance of a transmission line. The transformer provides non-integer-squared impedance transformation ratios without the need for tapping one of the windings or the use of other non-balanced techniques.

2 Claims, 3 Drawing Sheets

BROADBAND IMPEDANCE TRANSFORMER

BACKGROUND OF THE INVENTION

The present invention relates to devices which transform the characteristic impedance of signal conductors and particularly transformers for high frequency signal transmission lines.

Transmission lines are frequently used to transmit high frequency electronic signals. In general, a transmission line comprises at least two parallel electrical conductors. The shape, size, spacing, and material of the conductors as well as the electrical attributes of any material used to insulate the conductors determine the characteristic impedance of the transmission line.

Generally, the impedance of a transmission line is selected to match that of the units which the line is connecting. However, not all units have the same characteristic impedance. If an output unit oof one impedance is connected by a transmission line to an input unit of a second impedance without a transformation of the impedance, signal reflections may arise at the ports of both the input and output units. The signal reflections caused by the mismatched impedance may cause signal distortion, ghost signals and/or noise and may cause a decrease in the efficiency of the signal transmission.

To avoid the problem caused by mismatched impedance, it is known to utilize a transformer at some point along the transmission line. The transformer is constructed to provide the correct impedance ratio between the output unit and the input unit.

A variety of impedance transformation devices for high frequency signal transmission lines are known. The U.S. Pat. No. 3,370,257 to Spierling discloses a transformer comprising a plurality of coaxial transmission lines, wherein each line is wound for a plurality of turns around a ferrite toroid. The lines are connected to each other i parallel at their input ends and in series at their output ends to provide an impedance transformation ratio of $n^2$, where n is the number of lines in the transformer.

Another type of high frequency transformer is disclosed in U.S. Pat. No. 4,222,016 to Stock et al in which the transformer is comprised of a pair of identical sections of coaxial cable, each coaxial cable having an internal an an external conductor. The two sections have a length of approximately one-quarter of the operating wavelength of the signal transmitted and are disposed in parallel to one another. If the two sections are connected so that the internal conductor of the input end of a first one of the sections is connected to the external conductor of the input end of the second section, if the external conductor of the output end of the first section is connected to the external conductor of the output end of the second section, and if the unconnected conductors serve as terminals; the two sections will perform as a high frequency transformer with a transformation ratio of 1:1.

Other transformation ratios are also possible using such a transformer by providing two or more pairs of coaxial conductor sections, with the conductors of each pair connected to each other as described above and each pair connected to the other pairs so that one end is parallel connected and the other end is connected in series. In such transformers, transformation ratios of $n^2$ are attainable, where n equals the number of pairs of coaxial conductor sections used in the transformer.

It is also known to construct a high frequency transformer comprising two parallel sections of metal tubing electrically connected at one end and an electrical conductor wound through the hollow interiors of the tubing along their axes. Generally, in such transformers the two tubes form the primary winding with the free ends of the tubes carrying terminals for the input side of the transformer. The electrical conductor which passes an equal number of times through each of the tubes form the secondary winding with the two ends of the conductor carrying terminals for the output side of the transformer. Such transformers provide impedance ratios of $n^2$, where n represents the number of turns of the conductor through the sections of tubing.

Typical prior art transformers for high frequency transmission lines provide impedance transformation ratios of $n^2:1$ (or $1:n^2$), where n represents an integer. Such transformers may be adequate for those applications in which the electrical units being coupled have integer-squared ratios. A well known example of such an application is a UHF television antenna network typically having an impedance of 75 ohms and UHF RF signal processing circuitry in the typical television receiver which has an impedance of approximately 300 ohms. Unfortunately, not all electrical devices which are connected by transmission lines have impedances which are integer-squared ratios of each other. In such circumstances, efficient transmission line transformers with non-integer-squared impedance ratios are required.

Accordingly, it is an object of the present invention to provide a novel transmission line transformer with a non-integer-squared impedance transformation ratio.

It is another object of the present invention to provide a novel trannsmission line transformer which minimizers the production of reflected waves.

It is a further object of the present invention to provide a novel transmission line transformer which transforms the characteristic impedance of a transmission line with relatively high efficiency compared to prior transformers.

It is yet another object of the present invention to provide a novel transmission line transformer which may be easily and inexpensively manufactured.

It is a still further object of the present invention to provide a novel transmission line transformer which is capable of operating with transmission lines which are transmitting high voltage, high frequency signals.

These and other objects and advantages of the present invention will become apparent upon a perusal of the following description when taken in conjunction with the accompanying drawings.

DETAILED DESCRIPTION OF PREFERRED EMBODIMENTS

Figure 1:
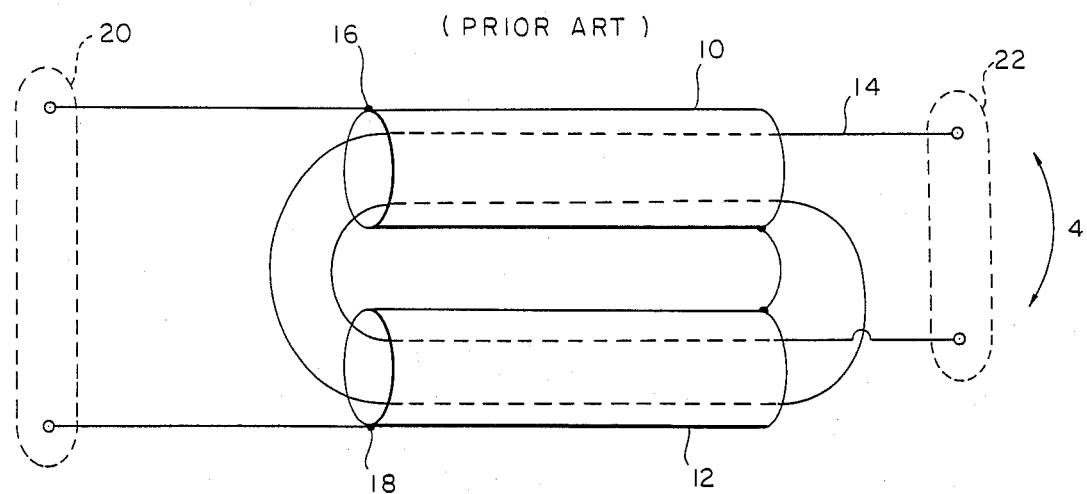
FIG. 1 is a pictorial view of a prior art transmission line transformer.

With reference to FIG. 1, prior art transformers are known which comprise two parallel sections of metal tubing 10, 12 and an electrical conductor 14 wound for at least one turn through the interior of the sections 10, 12. Each of the sections 10, 12 carries a terminal 16, 18 for connecting the transformer to a first transmission line 20 having a characteristic impedance of Z. The two ends of the conductor 14 are connected to a second transmission line 22.

By electrically connecting together the two ends of the sections 10, 12 distal from the terminals 16, 18, the sections 10, 12 may serve as the primary winding of the transformer. When high frequency signals are transmitted along the transmission line 20, the signals are conducted along the primary winding (comprising the sections 10, 12) and are induced into the conductor 14 wound through the interior of the sections 10, 12. Thus, the conductor 14 serves as the secondary winding of the transformer.

With continued reference to FIG. 1, the characteristic impedance of the signal induced in the conductor 14, and hence into the second transmission line 22, is a function of the square of the number of turns of the conductor 14 through the sections 10, 12. In the transformer depicted in FIG 1, the characteristic impedance of the signal induced in the conductor 14 is four times the impedance of signal at the first transmission line 20 because the secondary winding contains two turns of conductor 14. By increasing the number of turns of the conductor 14 through the sections 10, 12, the impedance ratio (e.g. the characteristic impedance of the signal at secondary winding divided by the characteristic impedance of signal at the primary winding), will increase as the square of number of turns. Since the number of turns is always an integer, the impedance ratios available using this type of transmission line transformer are limited to the series 1, 4, 9, 16...$n^2$ where n represents the number of turns of the conductor 14 through the conductor 10, 12.

The terminals of the prior art transformer illustrated in FIG. 1 may be reversed to obtain an impedance ratio of $1/n^2$. In such a transformer the conductor 14 serves as the primary winding and the two sections 10, 12 serve as the secondary winding. Note that the number of impedance ratios attainable by such a transformer is still limited to the inverse of the square of the number of turns of the conductor 14 through the sections 10, 12.

Typically, in conventional transformers (e.g. those not used for transmission lines), non-integer-squared impedance ratios may be obtained by tapping the secondary winding at a point other than after a complete turn. By use of such "tapping" techniques, non-integer turns ratios and hence non-integer-squared impedance transformation ratios may be obtained. However, such "tapping" techniques are not desirable in transmission line transformers because tapping may cause flux leakage and parasitic reactance losses and may destroy the balance between the primary and secondary windings.

Figure 2:
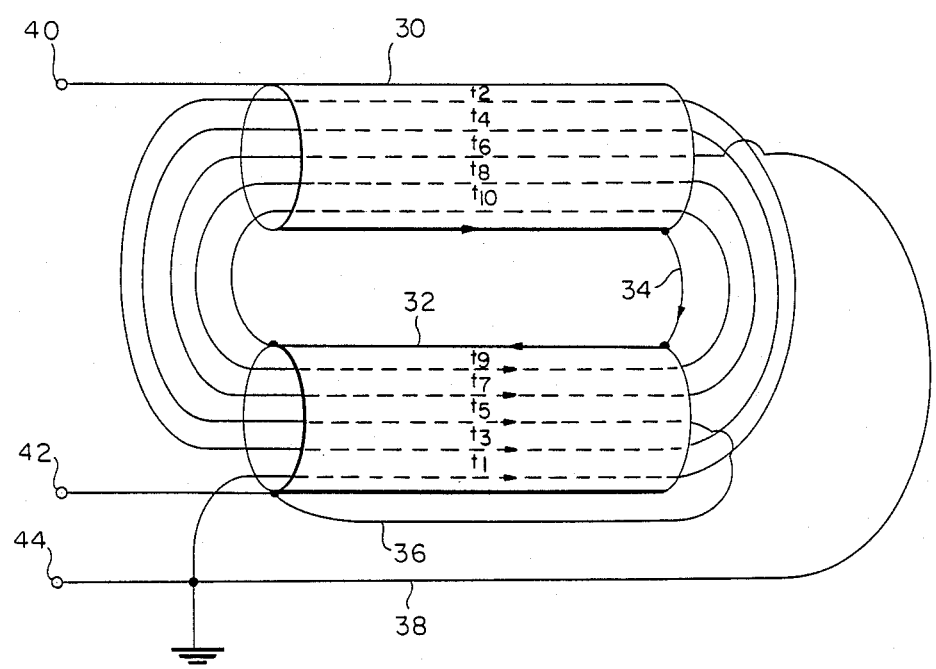
FIG. 2 is a pictorial representation of one embodiment of the transmission line transformer of the present invention.

An embodiment of the transmission line transformer of the present invention is depicted in FIG. 2. This transformer has a non-integer impedance ratio of 49:25. The transformer comprises two parallel sections of electrically conductive tubing 30, 32, electrically connected at one end by connector 34; first and second conductors 36, 38 wound through the interior of the sections; and three terminals: primary terminal 40, secondary terminal 42 and common terminal 44. Primary terminal 40 and secondary terminal 42 are each electrically connected to the free end on one of the sections 30, 32 respectively. A common terminal 44 is electrically connected to ground.

With continued reference to FIG. 2, one end of the first conductor 36 is connected to the free end of section 32. The first conductor 36 is wound through the interior of the sections 30, 32 for a plurality of turns, and the other end of the first conductor 36 is electrically grounded. In the embodiment illustrated in FIG. 2, the first conductor 36 passes three times through the interior of section 32 and passes twice through the interior of section 30.

The second conductor 38 is electrically connected in parallel to the first conductor 36, with one end connected to the free end of section 32 and the other end grounded. The second conductor 38 is wound for the same total number of turns through the sections 30, 32; however, the first turn of second conductor 38 is first wound through section 30. For reference, the turns of the first conductor 36 are designated in FIG. 2 as $t_1$ through $t_5$ and the turns of the second conductor 38 are designated $t_6$ through $t_{10}$.

In operation, the application of an RF potential signal across terminals 40 and 44 of the transformer depicted in FIG. 2, will induce an RF signal between terminals 42 and 44. A primary winding comprises the two sections 30, 32 and the conductors 36, 38. A secondary winding comprises the conductors 36, 38, providing a turns ratio between the primary winding and secondary winding of 7:5 and hence an impedance ratio of $(7:5)^2$ or 4:25.

Not only does the transformer of FIG. 2 provide a non-integer-squared impedance ratio, it obtains this ratio while maintaining balance among the windings (e.g. the ampere turns in adjacent winds net to zero). With continued reference to FIG. 2, the even-numbered turns of conductors 36, 38, e.g. $t_2, t_4, t_6, t_8$ and $t_{10}$ are within the interior of the first section 30 and the odd-numbered turns of conductors 36, 38 are within the interior of the second section 32. Thus, for balance the net current flowing through section 30 and the even-numbered turns must be zero. Similarly, the sum of the current flowing through section 32 and the odd-numbered turns must be zero.

Figure 3:
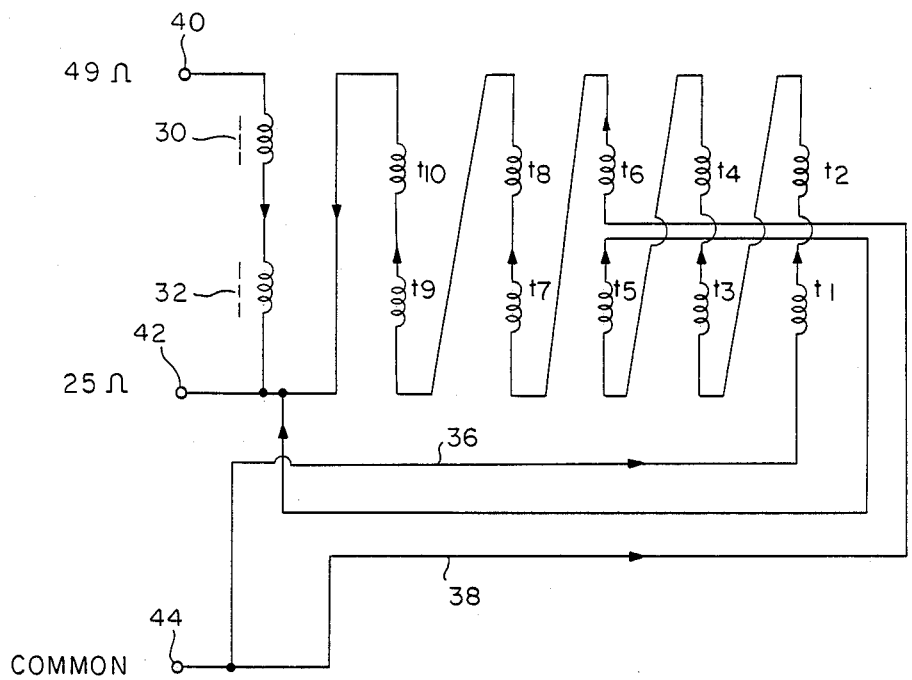
FIG. 3 is a simplified schematic diagram of the circuit of the transmission line transformer of FIG. 2.

A simplified schematic diagram of the circuit of the transformer of FIG. 2 is shown in FIG. 3, wherein like elements are identified with like reference number. In the circuit depicted in FIG. 3, balance is obtained when the sum of the current flowing through the first section 30 and through the turns within that section, (e.g. $t_2$, $t_4$, $t_6$, $t_8$ and $t_{10}$), equals zero. Likewise, the sum of the current flowing through the second section 32 and the current flowing through the odd-numbered turns must be zero in the circuit of FIG. 3.

Figure 4:
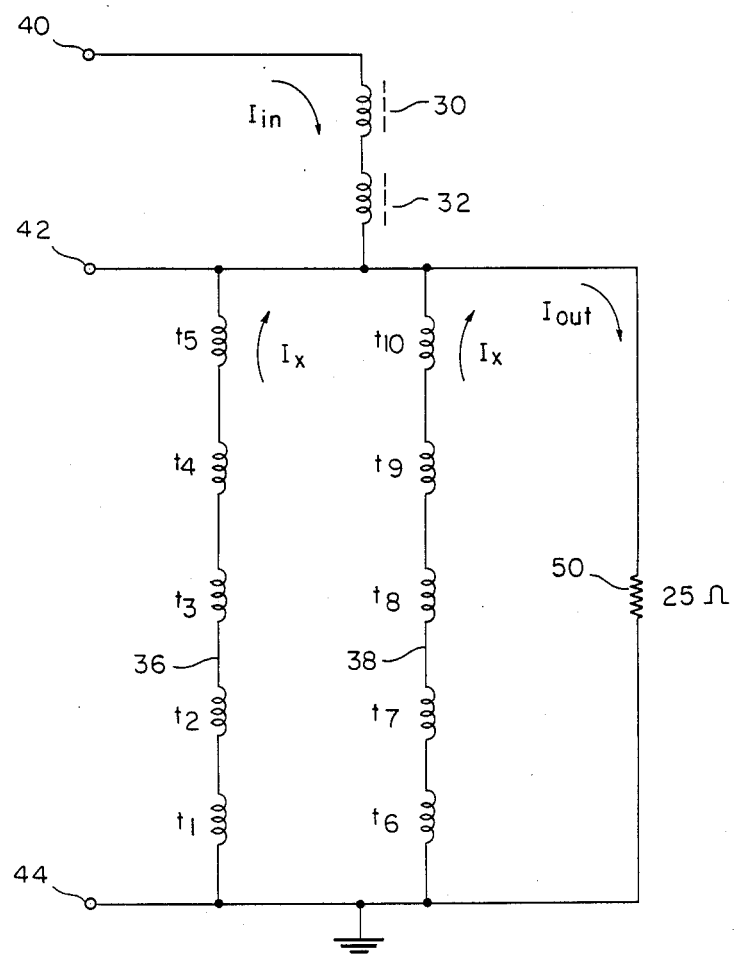
FIG. 4 is a simplified schematic diagram of the circuit of the transmission line transformer of FIG. 2, illustrating the current paths.

FIG. 4 presents the circuit diagram of FIG. 3 redrawn to illustrate the current paths with the transformer connected to a 25 ohm load 50. By assuming an output voltage V, the circuit of FIG. 4 can be shown to balance the ampere-turns in adjacent conductors.

For example, if it is assumed that there are 25 volts across the load 50, the output power can be calculated from the generation:

$$P = V^2/R \tag{1}$$

where:

P is the power
V is the voltage across the load, and
R is the impedance of the load
In the circuit of FIG. 4, $$P = (25)^2/25 = 25 \text{ watts} \tag{2}$$

Since each of the conductors 36, 38 is connected in parallel across 25 volts, each turn of the conductors must be connected across 5 volts each. Since the top turns, formed by the sections 30, 32, are coupled to the lower turns, each of the top turns also must have a 5 volt potential. Thus, the total voltage across the input (e.g., primary terminal 40 to common terminal 44) is 25+5+, or 35 volts.

If an ideal transformer ((e.g., loss less) is assumed:

$$P_{out} = P_{in} = 25 \text{ watts} \tag{3}$$

Thus, the resistance on the input side of the transformer can be calculated from equation (1) as follows:

$$P_{in} = V_{in}2/R_{in}, \text{ or} \tag{4}$$

$$R_{in} = (35)^2/25 = 49 \text{ ohm} \tag{5}$$

Knowing the input voltage and resistance, the input current $I_{in}$ can be calculated from:

$$V_{in} = I_{in}R_{in}, \text{ or } 35/49 = 0.71429 \text{ amps} \tag{6}$$

Likewise, the current out of the transformer can be calculated:

$$I_{out} = V_{out}/R_{out} = 25/25, \text{ or 1 amp} \tag{7}$$

Since conductors 36 and 38 are electrically connected in parallel and are symmetric, the current flowing through each of the conductors 36, 38 is equal (shown as $I_x$ in FIG. 4). Thus, $$I_{out} - I_{in} = 2 I_x \text{ or}$$

$$I_x = (1.0 - 0.71429)/2, \text{ or 0.14286 amp} \tag{9}$$

With the value of all the currents known, the ampere-turn balance of the transformer can be calculated. With reference to FIG. 3, the ampere-turns of the current flowing from the bottom through the first section 330 comprises the sum of the current flowing through each turn $t_2$, $t_4$, $t_6$, $t_8$ and $t_{10}$. From equation 9, the ampere-turns flowing from bottom to top must equal 5 times 0.14286, or 0.71429 ampere-turns. Only one turn has current flowing from top to bottom, the current flowing in the first section 30 itself. As is already shown in equation (6) for the first section 30, that current is 0.71429 amp. Since the first section 30 serves as one turn of the winding, the ampereturns of the current flowing from top to bottom in FIG. 3 is 0.71429 amp. equal and opposite to that flowing in turns of the conductors 36, 38 within the first section 30 and ampere-turn balance is thereby achieved in the transformer. A similar analysis for the second section 32 likewise shows the balance.

Figure 5:
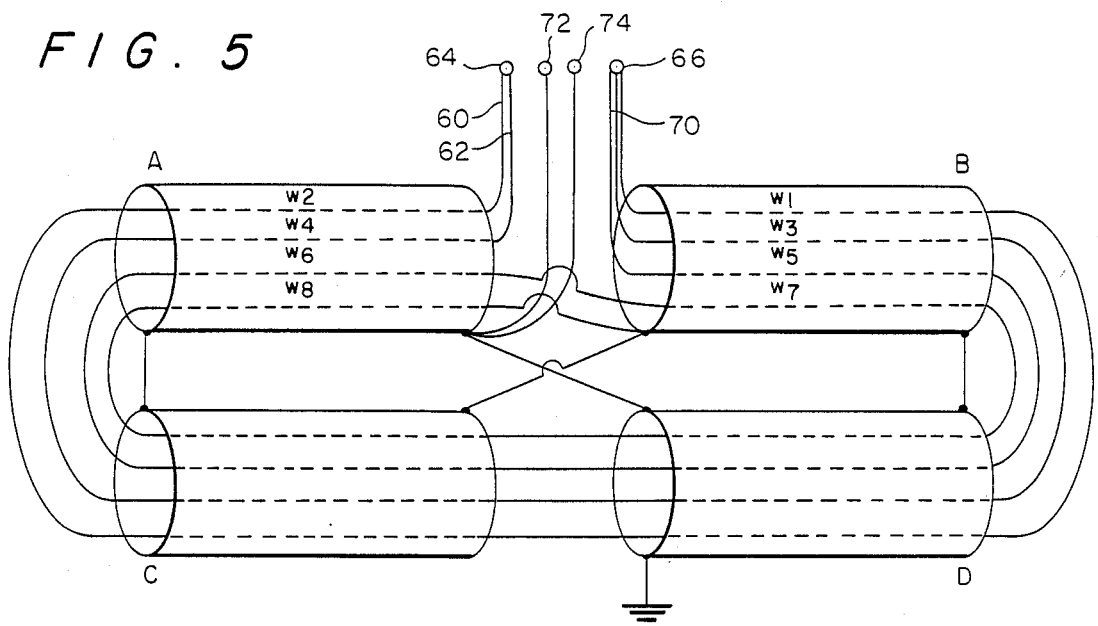
FIG. 5 is a pictorial representation of another embodiment of the transmission line transformer of the present invention.

Another embodiment of the transmission line transformer of the present invention is depicted in FIG. 5. The transformer comprises four tubes A, B, C and D, disposed such that tubes A and B are coaxial, tubes C and D are coaxial and tubes A and B parallel tubes C and D without extension. The ends of the tubes A and C external to the transformer are electrically connected, as are the ends of tubes B and D. The ends of the tubes interior of the transformer are cross-connected (e.g., A to D, and B to C) and the same end of tube D is electrically connected to a ground reference.

With continued reference to FIG. 5, a first conductor 60 and a second conductor 62 may be wound through the interior of tubes A, B, C and D to connect a first terminal 64 to a second terminal 66. A third conductor 70 may be connected from the second terminal 66 to the end of tube B interior of the transformer while passing for a number of turns through the interior of tubes A, B, C and D. In the embodiment of FIG. 5, the third conductor 70 is wound twice completely through the interiors of the tubes A, B, C and D.

Common terminals 72, 74 are both electrically connected to a ground reference, preferably by being connected to the end of tube A interior of the transformer.

In operation, terminals 64 and 72 may serve as the terminals of the primary winding and terminals 74, 66 as the terminals of the secondary winding. The primary winding thus comprises first and second conductors 60, 62, third conductor 70 and the electrical path formed by the tubes, e.g. tubes B and D in parallel with tubes C and A. The secondary winding comprises the third conductor 70 and the electrical path formed by the tubes.

Figure 6:
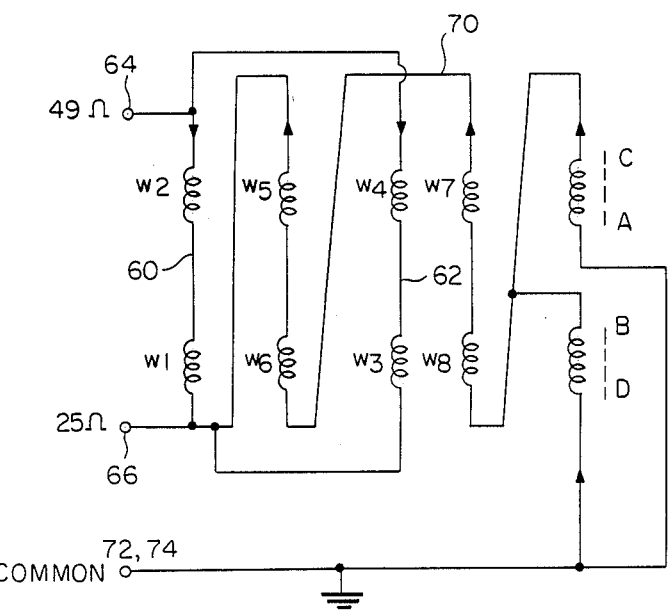
FIG. 6 is a simplified schematic diagram of the circuit of the transmission line transformer of FIG. 5.

Referring to FIG. 6, which depicts a simplified circuit diagram of the transformer of FIG. 5 and in which like elements are identified with like reference numbers, the higher RF potential terminal 64 of the primary winding is 7 impedance elements or turns of conductors 60, 62, 70 above the ground reference, no matter which electrical path is taken directly from the terminal 64 to ground. Likewise, the secondary terminal 66 is five impedance elements, or turns, above ground by any direct path. Thus, the turns ratio is 7:5 and the impedance transformation ratio is 49:25.

Performing an analysis of the circuit of FIG. 6 similar to that performed above for FIG. 3 demonstrates that the ampere-turns of adjacent conductors of the transformer are balanced, with the current flowing in the directions indicated by the arrowheads in FIG. 6.

The second embodiment of the transformer, depicted in FIG. 5, provides a number of advantages. The tubes A, B, C and D serve both as an electrostatic shield and as windings in the transformer. Unlike the first embodiment in which the tubes were at a relatively high RF potential, the tubes A, B, C and D are electrically connected to ground. The grounding eliminates the presence of a high potential electrical potential between the tubes A, B, C and D and ground and thereby reduce the tendency of the tubes to generate heat in loading cores during use.

With continued reference to FIG. 5, the split tube configuration of the transformer provides a further advantage in the reduction of the length of the conductors external to the tubes. Since conductors, especially single conductors, outside the electrostatic shield of the tubes can create unwanted signal reflections, the shortening of conductors external to the tubes can provide an increase in the efficiency of the transformer. Unlike the first embodiment in FIG. 2 in which the first conductor 36 transverses external to the sections 30, 32 of tubing from the end of section 30 to the ground reference point, the transformer in the second embodiment is able to achieve all needed connections without the need for long external conductors.

The transformer of the second embodiment has a still further advantage in that core losses are less. Although ultimately comprising three conductors 60, 62 and 70, the transformer can be wound with a single wire which is subsequently cut as needed. A single wire may be passed four times through the interior of the tubes A, B, C and D and cut to make the independent conductors shown in FIG. 5. Alternatively, a single coaxial wire may be passed twice through the interior of the tubes A, B, C and D and thereafter cut to the requirements of the circuit.

Many advantages will be apparent to one skilled in the art from the claims when accorded a full range of equivalence, the embodiments herein being illustrative and not limiting, and many other modifications will be readily apparent without departing from the scope of the invention.

What is claimed is:

1. A transformer to modify the characteristic impedance of a transmission line, comprising:
   two parallel sections of electrically conductive tubing, electrically connected to each other at one end;
   a first terminal at the free end of one of said sections of tubing;
   a second terminal at the free end of the other of said sections of tubing;
   a first electrical conductor having:
      one end electrically connected to said second terminal,
      a plurality of turns through the interior of said sections of tubing, and
      the other end electrically connected to a ground reference, and
   a second electrical conductor electrically connected in parallel to said first conductor, said second conductor having a like plurality of turns through the interior of said two sections of tubing, wherein the first turn of said turns of said first and second conductors are made through different sections of said tubing, so that the current flowing through each of said two sections of tubing is equal in amplitude and opposite in direction to the sum of the current flowing through each of said turns of said first and second conductors passing through the interior of such section of tubing.

2. A transmission line transformer for transforming the characteristic impedance of a first transmission line to that of a second transmission line, each of said transmission lines having two transmitting elements of unequal RF potential comprising:
   four substantially identical tubes, A, B, C, and D, of electrically conductive material, said tubes being coplanarly disposed so that:
      tubes A and B are coaxial,
      tubes C and D are coaxial, and
      the axis of tubes A and B parallels the axis of tubes C and D,
   said tubes being electrically connected so that:
      the internal end of tubes A and D are connected to a ground reference
   the external end of tubes A and C are connected,
   the internal ends of tubes B and C are connected,
   the external ends of tubes B and D are connected;
   a first plurality of electrical conductors electrically connected in parallel to each other and electrically connecting the higher RF potential element of said first transmission line to the higher RF potential element of said second transmission line, said conductors being wound for at least one turn through the interiors of said four tubes;
   a second electrical conductor electrically connecting the higher RF potential element of said second transmission line and the internal end of tube B, wherein said second conductor is wound for at least one turn through the interiors of said four tubes; so that the sum of the current flowing through each of said tubes and the turns of said first plurality of conductors and said second conductor worked through the interior of said tube is zero.

* * * * *